(12) United States Patent
Leverenz et al.

(10) Patent No.: US 6,214,247 B1
(45) Date of Patent: Apr. 10, 2001

(54) SUBSTRATE TREATMENT METHOD

(75) Inventors: Roy V. Leverenz, Smyrna; John Bost, Franklin, both of TN (US)

(73) Assignee: TDY Industries, Inc., Los Angeles, CA (US)

( * ) Notice: Subject to any disclaimer, the term of this patent is extended or adjusted under 35 U.S.C. 154(b) by 0 days.

(21) Appl. No.: 09/095,398

(22) Filed: Jun. 10, 1998

(51) Int. Cl.[7] ....................................................... B05D 3/04
(52) U.S. Cl. .......................... 216/56; 75/10.19; 427/309; 427/258
(58) Field of Search ..................................... 427/307, 309, 427/258; 216/37, 56, 75, 76, 77, 78; 75/10.19

(56) References Cited

U.S. PATENT DOCUMENTS

| | | |
|---|---|---|
| 4,282,289 | 8/1981 | Kullander et al. . |
| 5,236,740 | 8/1993 | Peters et al. . |
| 5,336,292 | 8/1994 | Weinl . |
| 5,368,938 * | 11/1994 | Holtz et al. ........................ 428/408 |
| 5,380,408 | 1/1995 | Sevensson . |
| 5,415,674 | 5/1995 | Feistritzer . |
| 5,419,927 | 5/1995 | Dietrich . |
| 5,560,839 | 10/1996 | Bennett . |
| 5,567,526 | 10/1996 | Peters et al. . |
| 5,571,616 | 11/1996 | Phillips et al. . |
| 5,700,518 | 12/1997 | Lee . |
| 5,713,133 | 2/1998 | Bhat . |
| 5,891,522 | 4/1999 | Olson . |
| 5,900,288 | 5/1999 | Kuhman . |

FOREIGN PATENT DOCUMENTS

WO 92/20841   11/1992   (WO) .

* cited by examiner

*Primary Examiner*—Randy Gulakowski
*Assistant Examiner*—Allan Olsen
(74) *Attorney, Agent, or Firm*—R. J. Pugh; P. J. Viccaro

(57) ABSTRACT

Method for removing a portion of the binder phase from the surface of a substrate that is composed of particles of at least a first phase joined together by the binder phase, and wherein the surface is etched by contacting it with a gas flow of an etchant gas and a second gas. The second gas is one or more gases that will not react with the substrate or the removed binder phase and will not alter the oxidation state of the substrate during etching.

19 Claims, 23 Drawing Sheets

(3 of 23 Drawing Sheet(s) Filed in Color)

SUBSTRATE TREATMENT METHOD

CROSS-REFERENCE TO RELATED APPLICATIONS

Not applicable.

STATEMENT REGARDING FEDERALLY SPONSORED RESEARCH OR DEVELOPMENT

Not applicable.

TECHNICAL FIELD AND INDUSTRIAL APPLICABILITY OF THE INVENTION

The present invention relates to a method for etching composite material substrates and other substrates, and also is directed to a method for applying wear-resistant and other coatings to composite material substrates and other substrates. The present invention also relates to composite material substrates, which are comprised of particles of a hard constituent phase in a binder material phase that binds together the hard constituent particles, having wear-resistant and other coatings. The present invention finds application in any field in which it is advantageous to enhance the adhesion of a wear-resistant and other types of coatings to substrates. Examples of fields of application of the present invention include the manufacture and treatment of dies used in metal stamping, punching, threading, and blanking, and the manufacture and treatment of metal cutting inserts used in milling, turning, drilling, boring, and other metal removal operations.

BACKGROUND OF THE INVENTION

Composite materials comprised of particles of a hard constituent phase and a binder phase binding the particles together are common and are referred to as "composite materials" or "composite substrates" hereinafter. Such materials also may be referred to as "cemented" composite materials and include, for example, ceramics, cermets, and cemented carbides. Cemented carbides, include, for example, materials composed of a hard particulate material such as, for example, particles of one or more of tungsten carbide (WC), titanium carbide (TiC), titanium carbonitride (TiCN), tantalum carbide (TaC), tantalum nitride (TaN), niobium carbide (NbC), niobium nitride (NbN), zirconium carbide (ZrC), zirconium nitride (ZrN), hafnium carbide (HfC), and hafnium nitride (HfN) cemented together by a binder phase that is composed predominantly of one or more of cobalt, nickel, and iron.

Metal cutting inserts fabricated from composite materials are commonly used in chip cutting machining of metals in the metal machining industry. Metal cutting inserts are commonly fabricated from particles of metal carbide, usually tungsten carbide with the addition of carbides of other metals such as, for example, niobium, titanium, tantalum, and a metallic binder phase of cobalt or nickel. The carbide materials provide high strength but still may wear quickly when used in, for example, milling and other metal machining operations. By depositing a thin layer of wear-resistant material on the working surfaces of cemented carbide cutting inserts it is possible to increase the wear-resistance of the inserts without adversely affecting toughness. Commonly used wear-resistant cemented carbide insert coatings include, for example, TiC, TiN, TiCN, and $Al_2O_3$. Such wear-resistant coatings reduce the erosion and corrosion of the inserts' binder material.

The utility of coated composite materials such as coated cemented carbides is limited by the strength of adhesion of the wear-resistant coating to the composite material. Absence of strong adhesion between wear-resistant coatings and metal cutting inserts causes delamination of the coatings from the inserts, decreasing the inserts' service life. The presence of cobalt at the inserts' surfaces also increases the tendency of the coatings and substrates to experience delamination during use. Accordingly, it would be advantageous to provide a novel method for increasing the adhesion of wear-resistant coatings to composite materials. More broadly, it would be advantageous to enhance the adhesion of wear-resistant coatings and other types of coatings to composite material and other types of substrates.

SUMMARY OF THE INVENTION

The present invention provides a method for removing a portion of the binder phase from a substrate that is composed of at least particles of a first phase joined together by the binder phase. The present method includes the step of etching at least a portion of a surface of the substrate by contacting the surface with a gas flow that is composed of at least an etchant gas and a second gas for a time period that will allow for removal of the desired amount of binder phase. The second gas comprises one or more gases that will not react with the substrate or the removed binder material and that will not alter the oxidation state of the substrate during the etching step. Preferably, the second gas is one or more gases that will not react with the substrate or the removed portion of binder material to form deposits of a phase of $W_xCo_yC$ (wherein x=3–9 and y=2–6), also referred to herein as an η (eta) phase, on the substrate.

The etchant gas used in the present method may be any gas or combination of gases that will suitable remove the desired portion of the binder phase from the substrate during the etching step. Possible etchant gases include hydrogen chloride gas, $H_2F_2$ gas, and gaseous forms of any of the Group VIIA elements. Other possible etchant gases useful in the present method will be apparent to those having ordinary skill once apprised of the present invention. The second gas may be, for example, one or more gases selected from nitrogen gas, helium gas, argon gas, and neon gas. Preferably the gas flow is applied to the substrate during the etching step by introducing a flow of the etchant gas concurrently with a flow of the second gas into a chamber containing the substrate at a pressure and temperature, and for a time, that will result in removal of the desired portion of the binder phase. In one particular application of the present method, the gas flow consists of concurrent flows of hydrogen chloride gas and nitrogen gas.

Preferably, during the etching step binder phase is removed from a surface of the substrate to a depth of between about 3 microns to about 15 microns, and more preferably to a depth of between about 4 microns to about 6 microns.

The method of the present invention preferably is applied to substrates composed of a composite material comprising particles of a hard constituent material joined together by a binder material. Examples of such composite materials include cemented carbides and cermets. Examples of the binder material of such composite materials include materials composed of one or more materials selected from cobalt, nickel, iron, elements within Group VIII of the periodic table, copper, tungsten, zinc, and rhenium. Once apprised of the details of the present invention, one of ordinary skill in the substrate coating and treatment arts will comprehend additional composite materials to which the present invention may be applied.

The present invention also is directed to a method for applying a coating to at least a portion of the surface of a substrate, preferably a composite substrate that includes hard constituent material particles joined together by a binder. The method is carried out by removing a portion of the binder from a surface of the substrate by contacting the surface with a gas flow including an etchant gas and a second gas for a period of time that will remove the desired portion of binder. The surface etching effect of the etchant gas provides an etched surface on the substrate, and the etched surface will include voids produced as the binder is etched away from between hard constituent particles. The second gas is one or more gases that will not react with the substrate or the portion of the binder removed from the substrate, and that will not change the oxidation state of the substrate during the etching process. Preferably, the second gas will not react during the etching process to form eta phase within the voids etched in the substrate's surface. In a subsequent step of the method, a coating is applied to at least a portion of the etched surface. At least a portion of the coating is deposited within at least a portion of voids on the etched surface created by removal.

Thus, the etching step of the present invention may be preceded or followed by one or more additional steps, including, for example, the step of depositing a coating on the etched surface of the substrate produced by the etching step. Because the coating infiltrates voids in the etched surface of the substrate that have been produced by removal of binder material during the etching step, the adhesion of the coating to the substrate is enhanced. Preferably, the coating is one that enhances the wear resistance of the substrate, but it also may be selected from any other conventional substrate coating. Possible wear-resistant coatings that may be applied in the coating step of the present method include those composed of, for example, one or more of TiC, TiN, TiCN, diamond, $Al_2O_3$, MT-milling coating (described in detail below), TiAlN, HfN, HfCN, HfC, ZrN, ZrC, ZrCN, BC, $Ti_2B$, MoS, $Cr_3C_2$, CrN, CrCN, and CN.

The present invention is also directed to substrates that have been produced by the method of the present invention. For example, such substrates within the scope of the invention may have an etched surface produced by the foregoing etching step, and also may have a coating, wear-resistant or otherwise, which at least partially infiltrates voids produced in the substrate's surface by the etching step of the invention. In particular, the present invention is directed to a substrate composed of a composite material including particles of a hard constituent material and a binder material. The substrate includes an etched surface portion having voids thereon produced by removing a portion of the binder material therefrom by contacting the surface portion with concurrent flows of at least a suitable etchant gas and a second gas. The second gas must be incapable of reacting with the substrate or the removed binder material or changing the oxidation state of the substrate during etching of the binder material. A coating may be adhered to at least a portion of the etched surface portion of the substrate, and at least a portion of the coating is deposited within at least a portion of the voids provided in the etched surface portion.

Examples of applications of the method of the present invention include the manufacture and treatment of wear resistant cutting inserts, dies, punches, and other elements used in applications such as: metal stamping, punching, threading, blanking, milling, turning, drilling, boring, and other metal removal operations; mining and oil drilling, including fabricating or treating mining and drilling bits used in long wall and coal boring miners, tricone, percussive and rooftop drilling bits, road planing and other like applications; wood working applications, including fabricating or treating bits and blades used in sawing, planing, routing, shaping, and other woodworking applications; drawing, heading, and back extrusion, including the fabrication and treatment of punches and dies used in such applications; rod mill rolls; and high corrosion environments. An example of a specific application of the present invention is in the manufacture and treatment of items made from tungsten-based alloys containing iron, nickel, copper and/or cobalt. Such items include, for example, aircraft weights, electrical contact points, and electrodes.

The reader will appreciate the foregoing details and advantages of the present invention, as well as others, upon consideration of the following detailed description of the invention. The reader also may comprehend such additional details and advantages of the present invention upon practicing the invention.

BRIEF DESCRIPTION OF THE DRAWINGS

The file of this patent contains at least one drawing executed in color. Copies of this patent with color drawing (s) will be provided by the Patent and Trademark Office upon request and payment of necessary fee.

The features and advantages of the present invention may be better understood by reference to the accompanying figures, in which.

DETAILED DESCRIPTION OF THE INVENTION

Figure 1:
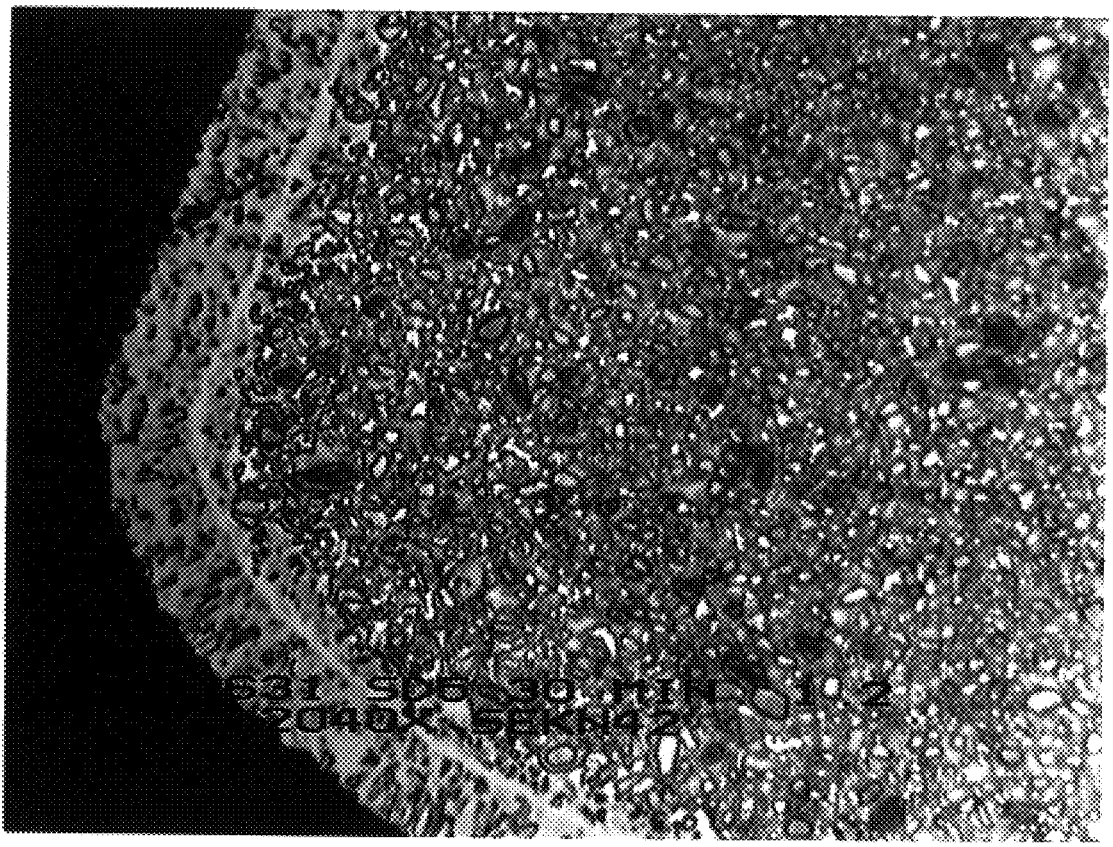
FIG. 1 is a photomicrograph of a prepared section of a metal cutting insert composed of SD-5 material coated with wear-resistant MT-milling (moderate temperature milling and turning) coating by the method of the present invention.
Figure 2A:
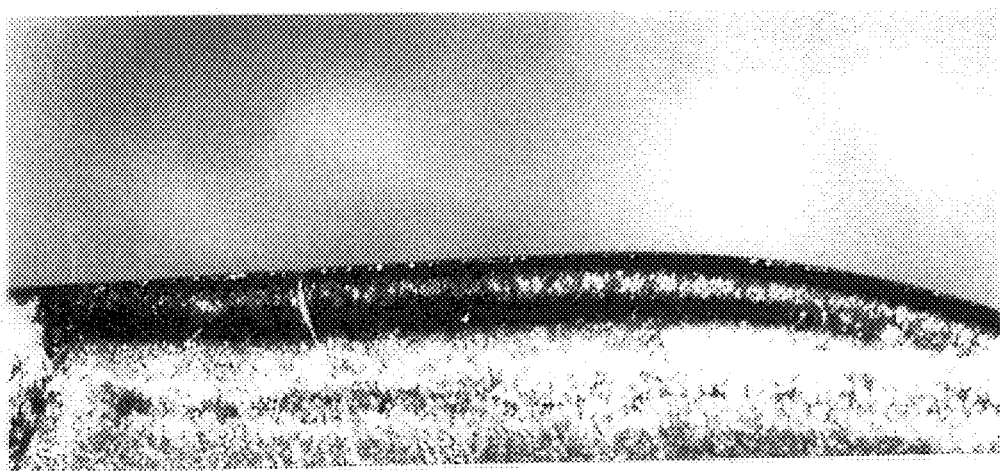
FIGS. 2a–2c and 3a–3c are photomicrographs showing the condition of an edge surface of each of three metal cutting inserts, composed of SD-5 material and coated with an MT-milling coating by the method of the invention, after 10 and 18 milling passes, respectively.
Figure 2B:
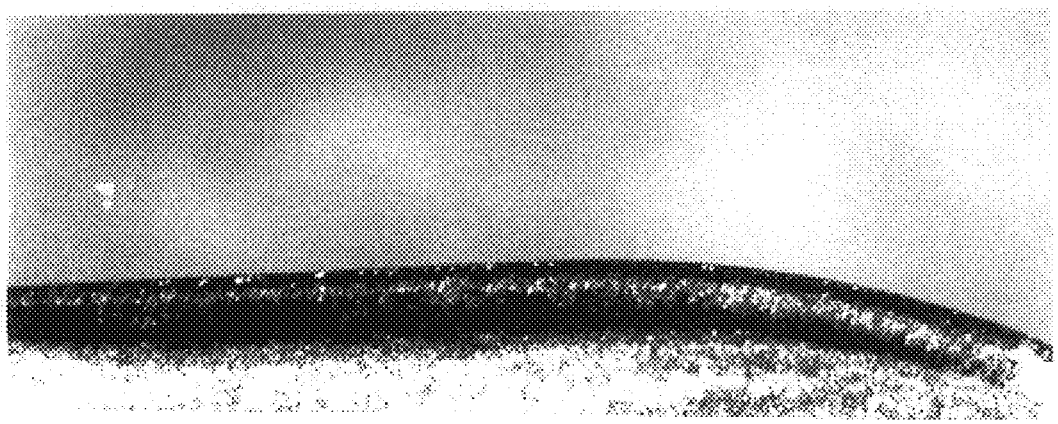
Figure 2C:
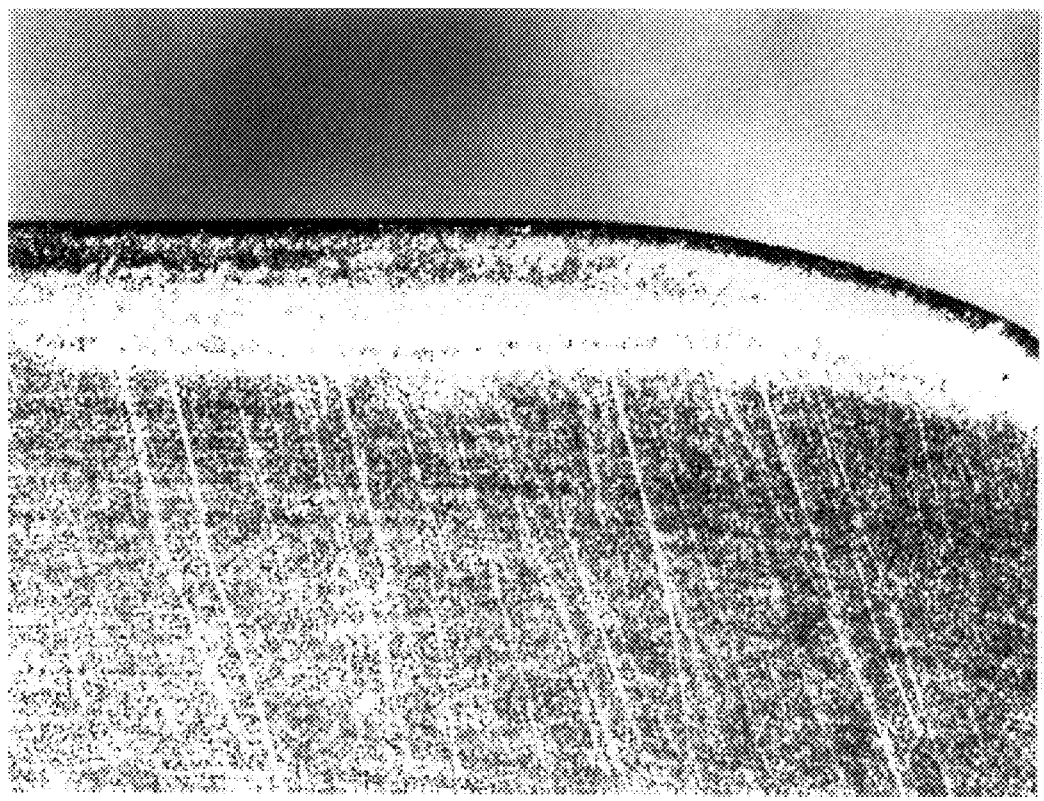
Figure 3A:
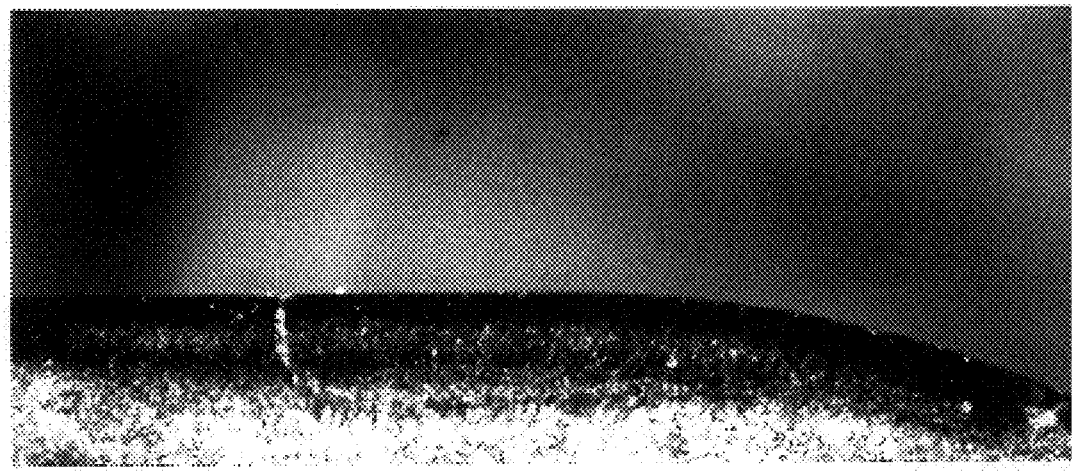
Figure 3B:
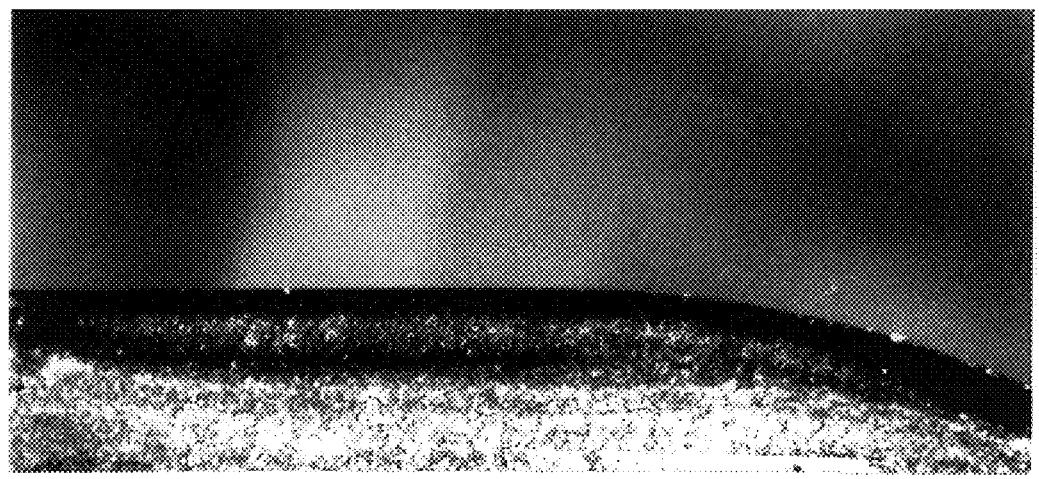
Figure 3C:
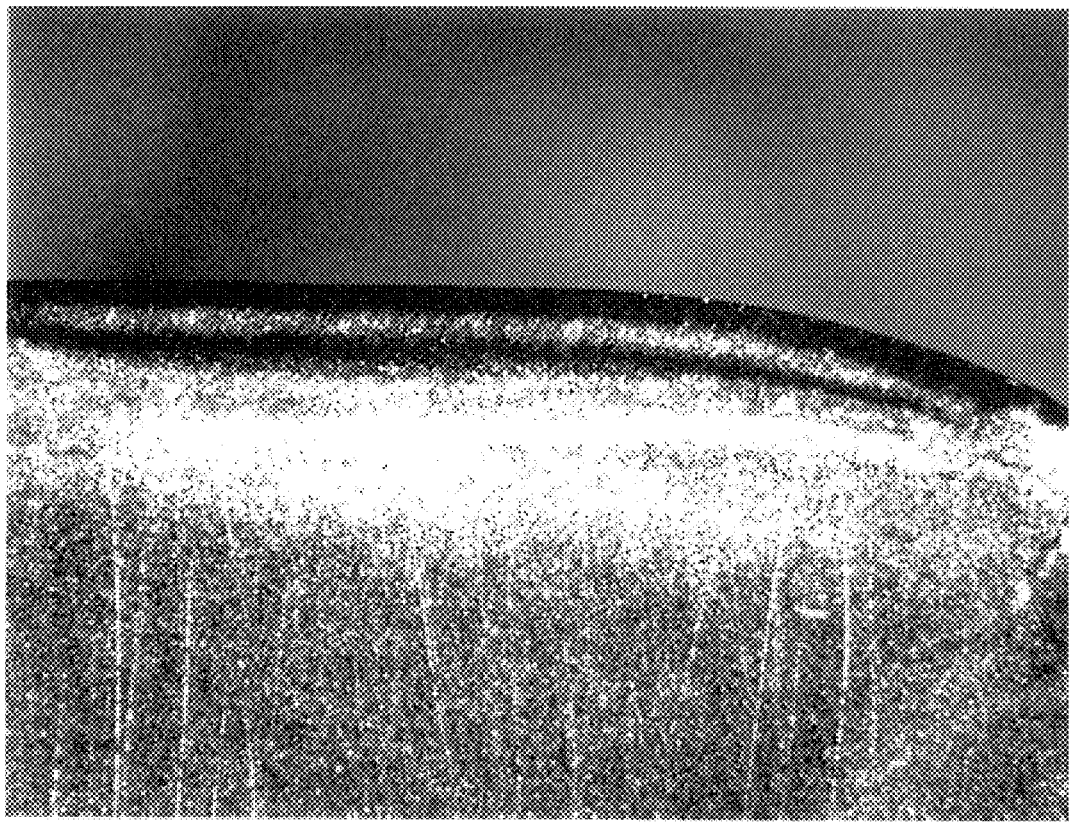
Figure 4A:
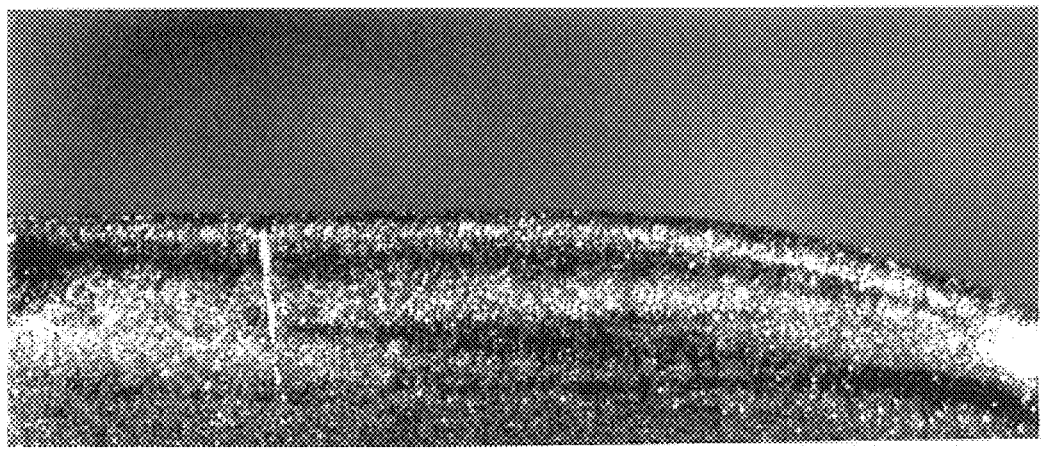
FIGS. 4a–4c and 5a–5c are photomicrographs showing the condition of an edge surface of each of three uncoated metal cutting inserts, composed of SD-5 material, after 10 and 18 milling passes, respectively.
Figure 4B:
Figure 4C:
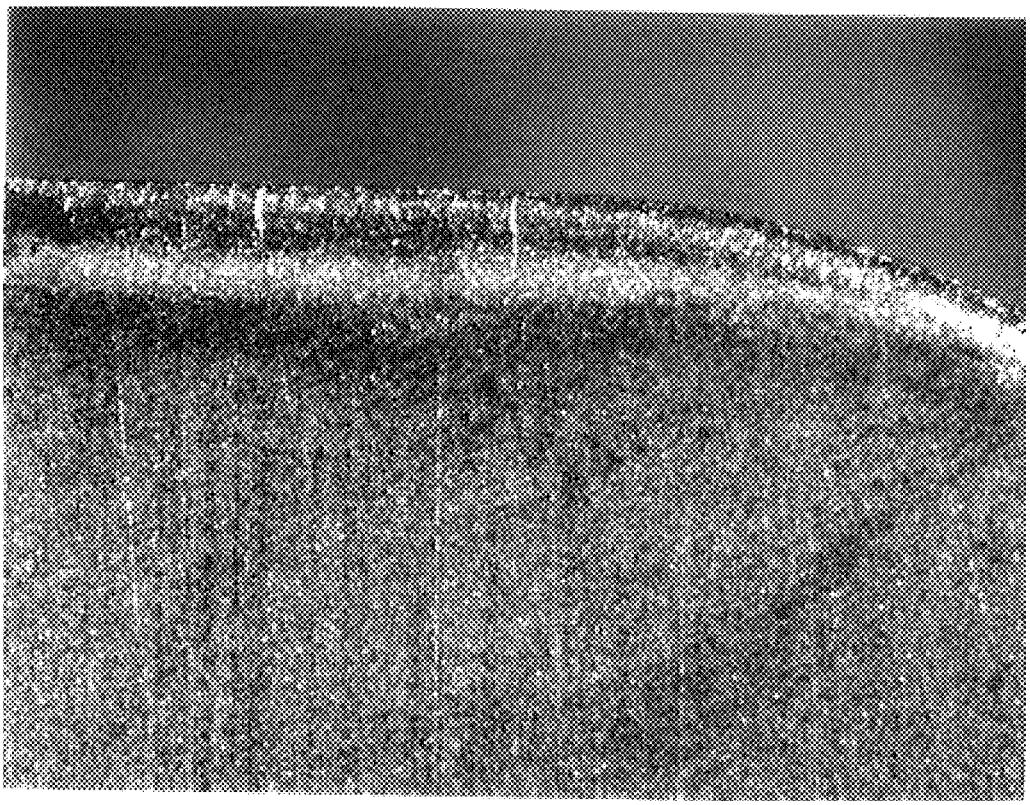
Figure 5A:
Figure 5B:
Figure 5C:
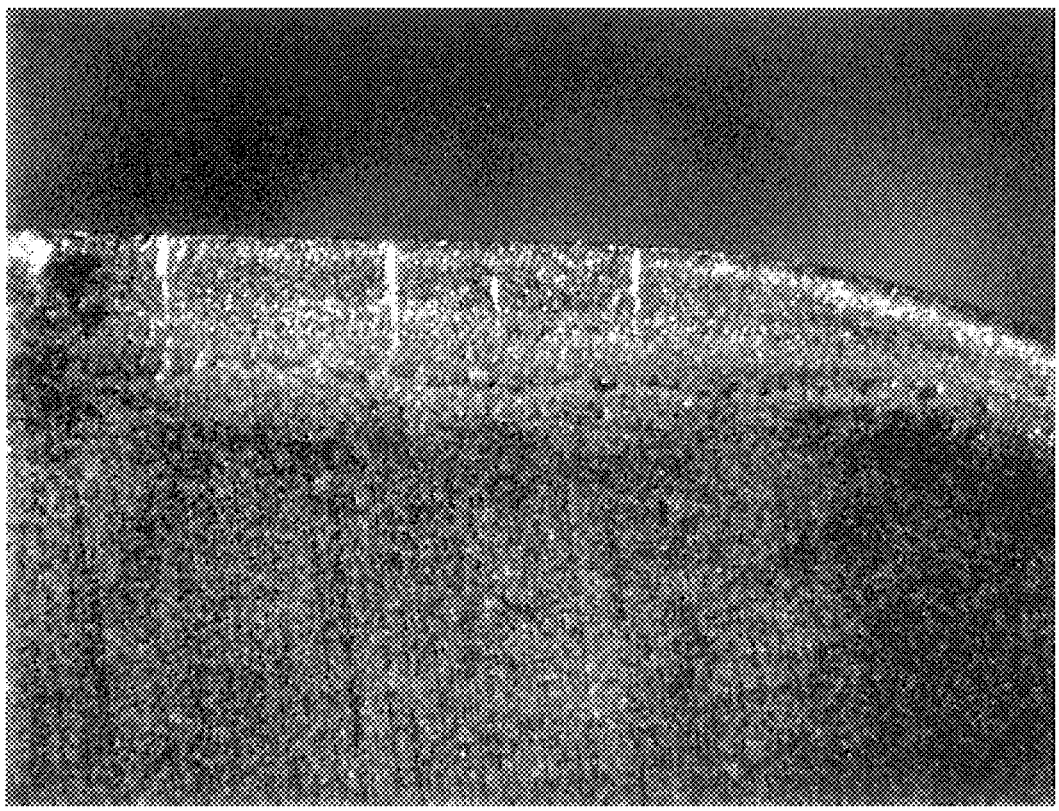
Figure 6A:
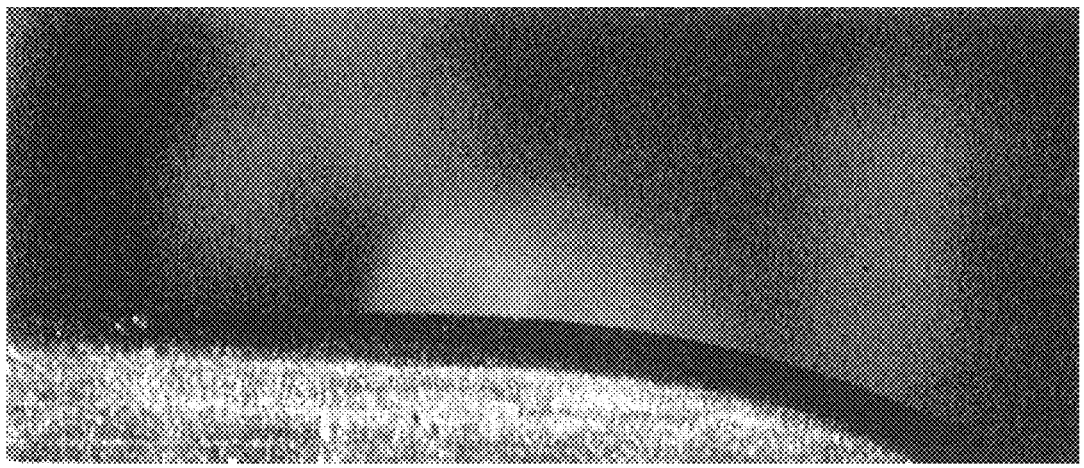
FIGS. 6a–6c are photomicrographs showing the condition of an edge surface of three metal cutting inserts, composed of T-14 material and coated with an MT-milling coating by the method of the invention, after 4 milling passes.
Figure 6B:
Figure 6C:
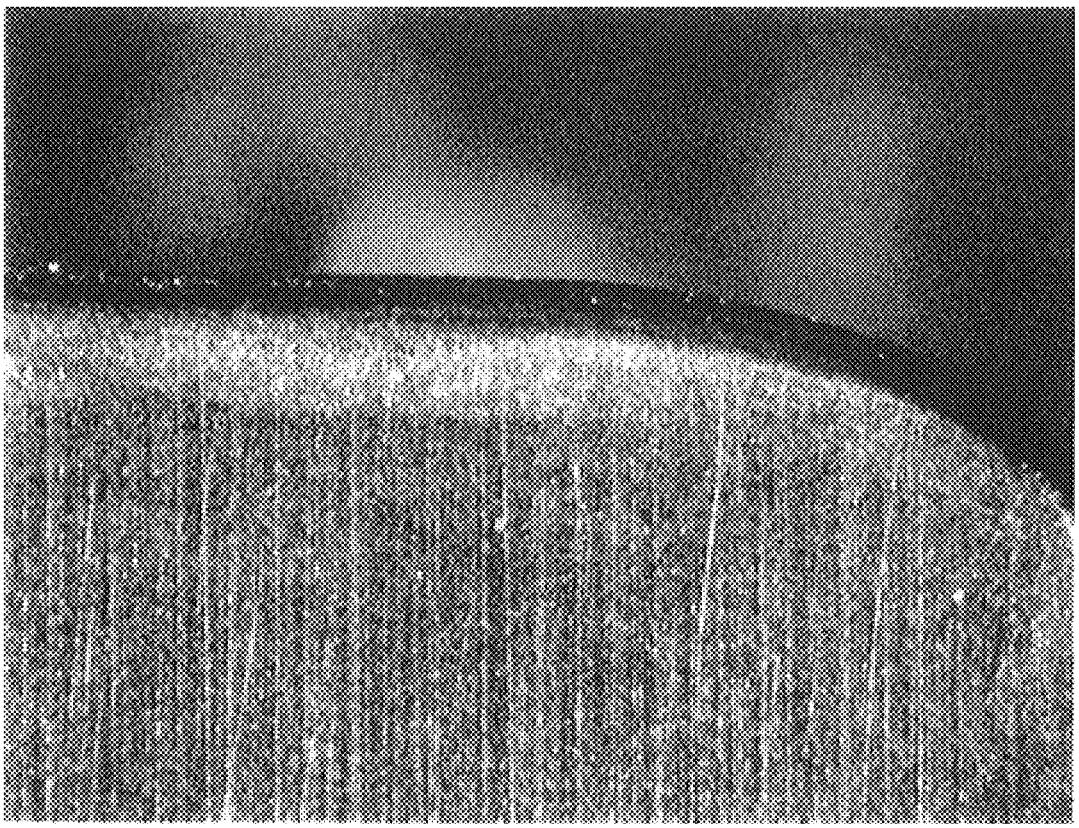
Figure 7A:
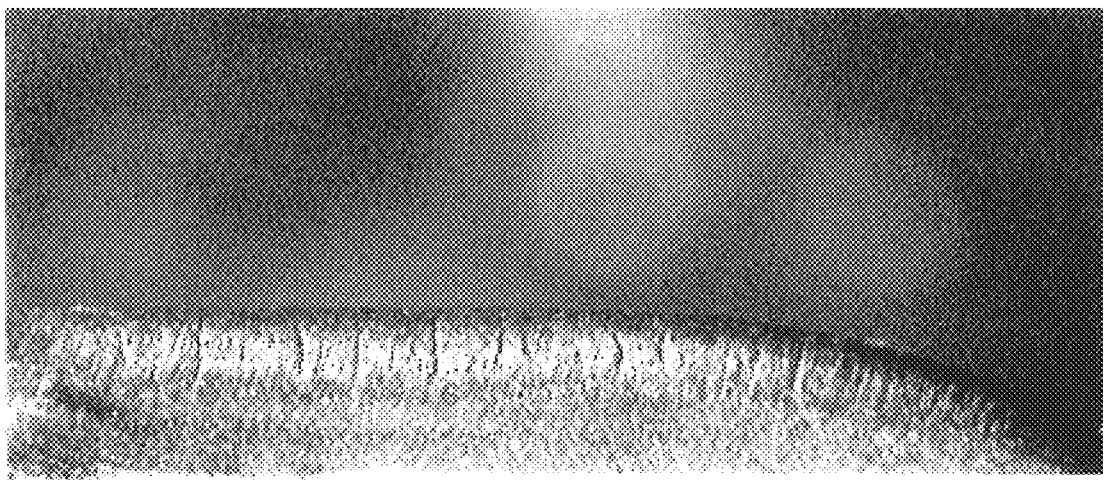
FIGS. 7a–7c are photomicrographs showing the condition of an edge surface of three metal cutting inserts composed of T-14 material, each insert both unetched and uncoated, after 4 milling passes.
Figure 7B:
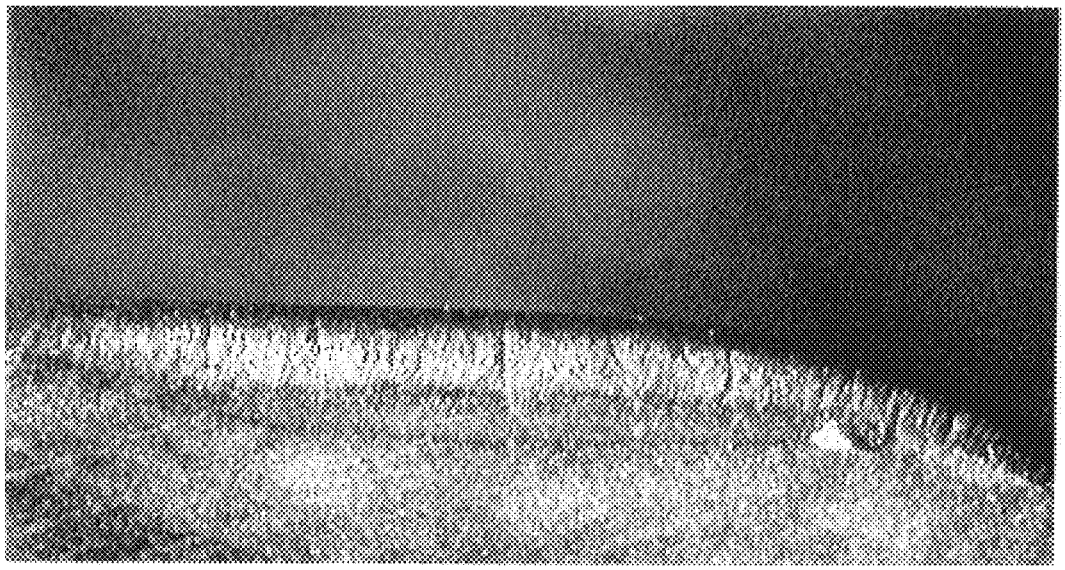
Figure 7C:

An aspect of the present invention is directed to a method for applying a coating, preferably a wear-resistant coating, to a composite material substrate. The composite material substrate includes a phase of a hard constituent and also includes a binder phase that is predominantly one or more of cobalt, nickel, and iron. The present inventors have discovered that the method of the invention enhances the adherence of the coating to the composite material substrate and inhibits delamination of the coating. The present invention also is directed to etched and etched/coated substrates prepared by the method of the present invention.

It is believed that in relation to the known composite material substrate coating methods, the present method improves adhesion between composite material substrates and wear-resistant coatings by allowing the coatings to infiltrate the surface of the substrate. To accomplish this, a portion of the binder phase of a surface region of the composite material substrate is removed by a novel etching procedure, preferably to a depth in the range of about 3 to about 15 microns (inclusive), while leaving the hard constituent particles in the surface region substantially intact. Wear-resistant coatings applied to composite material substrates that have been etched by the present method infiltrate the voids in the surface region created by removal of the binder phase. The infiltration of the coating is believed to increase the adhesive strength between the coating and the composite material substrate. It has been found that the enhanced adhesion between coatings and composite material substrates achieved by the present method reduces differences in thermal expansion between the substrates and coatings, improves the coatings' resistance to deformation, increases coating wear resistance, and reduces the occurrence of thermal cracking.

As used herein, "composite material" refers to a material, in any form, that includes at least particles of a phase of a hard constituent material and a phase of a binder material that binds together the hard constituent particles. The composite material may be, for example, cemented carbides and cermets. The binder material of the present composite material may include one or a combination of more than one of cobalt, nickel, copper, and iron. In addition to cobalt, nickel, copper, and/or iron, the binder material may include other elements and compounds as are known in the art. Such other elements include, for example, those within Group VIII of the periodic table (elements having atomic numbers 26–28, 44–46, and 76–78), tungsten, zinc, and rhenium. The particles of the hard constituent may be, for example, particles composed of:

- one or more carbide materials selected from tungsten carbide (WC), titanium carbide (TiC), tantalum carbide (TaC), niobium carbide (NbC), vanadium carbide (VC), chromium carbide ($Cr_3C_2$), molybdenum carbide (MoC), and iron carbide (FeC);
- one or more carbonitrides and/or nitrides of one or more of the refractory metals, including carbonitrides of one or more of W, Ti, Ta, Nb, V, Cr, Mo, and Fe;
- one or more oxides and/or borides of one or more of aluminum, zirconium, and magnesium; and
- one or more of tungsten, molybdenum-based materials, and tungsten-based materials.

As used herein, the term "refractory metals" refers to metals having an extremely high melting point, for example, W, Mo, Ta, Nb, Cr, V, Re, Ti , Pt, and Zr.

In addition to enhancing the adhesion of wear-resistant coatings to the foregoing composite materials, it is believed that the method of the present invention also may be used to enhance the adhesion of wear-resistant and other types of coatings to other types of materials, including, for example, heavy metals, sialons, $Si_3N_4$, and composite ceramics, that have a phase that may be etched by the present method. The identities of such other materials may be readily determined by those having ordinary skill in the substrate coating arts. Moreover, although the following examples are directed to the application of wear-resistant coatings to composite material and other substrates, it will be understood that the present method also may be used to better adhere other types of coatings to such substrates. Such other coatings include coatings that impart desirable properties to the substrate surface, such as, for example, coatings that enhance the substrate's resistance to corrosion, including oxidation, or that provide a particular surface appearance to the substrate. The identities of other coatings that may be applied using the method of the present invention will be readily apparent to those having ordinary skill in the substrate coating arts once apprised of the invention.

In one embodiment of the method of the present invention, the method generally includes at least the following steps:

1. Place a composite material substrate to be coated in a chamber of a chemical vapor deposition furnace.
2. Etch away all or a portion of the binder phase in a surface region of the composite material substrate to a depth of about 3 microns to about 15 microns by contacting the surface region with a mixture comprising an etchant gas and an inert gas such as nitrogen gas. (The etchant gas may be selected from, for example, gaseous hydrogen chloride, gaseous $H_2F_2$, or the gaseous form of any of the Group VIIA elements. Other suitable etchant gases will be apparent to those of ordinary skill in the art or may be determined by such persons without undue experimentation, and it will be understood that the identity of such suitable alternative etchant gases will depend on the particular composition of the material that is to be etched. The gaseous mixture is applied to the surface of the material to be etched under conditions and for a time suitable to remove the desired amount of binder phase from the material. Such conditions and times may be readily ascertained, without significant experimentation, by those having ordinary skill in the substrate coating arts.)
3. Purge the chamber with a flow of an inert gas ("inert" meaning that it will not react with the binder material) such as, for example, nitrogen, argon, or helium gas.
4. Coat the etched region of the composite material substrate with at least one layer of a wear-resistant material by introducing a reactive gaseous form of the wearresistant material into the chamber under conditions that will result in the deposition of the wear-resistant material on the etched region. (Such conditions, which generally include such parameters as reactive gas flow rates, chamber gas pressure, chamber and/or substrate temperature, and reaction time) may be readily ascertained by those having ordinary skill in the substrate coating arts once apprised of the present invention.

Although the method of the invention is disclosed above as being carried out in a chamber of a chemical vapor deposition (CVD) furnace, it will be understood that the etching step may be carried out in any chamber that is sealed from the environment and into which a flow of the gases may be introduced. An advantage of carrying out the process in a CVD furnace is that the etching, purging, and coating steps may be carried out sequentially in the furnace chamber without the need to move the composite materials from one chamber to another during the process. Thus, the method of the invention may be programmed as a complete cycle in the CVD furnace and accomplished in one run. This feature of the invention provides a distinct advantage over procedures wherein a liquid solution etchant is used to remove binder phase material because such liquid solutions cannot be introduced into the same chamber employed to coat the substrate by a CVD or PVD process. Also, it has been found that the substrate may be kept cleaner and the depth of etching may be better controlled when using a gaseous etchant as opposed to a liquid etchant.

The step of etching binder phase from the composite material substrate preferably should remove binder material to a depth of about 3 to about 15 microns and more preferably about 4 to about 6 microns, into the substrate surface. Too shallow an etching depth does not provide a significant enhancement in coating adhesion. Too great an etching depth weakens the surface of the substrate. Etching time may be varied to account for differences in the susceptibility of the particular binder phase to be removed by the etchant gases. Those having ordinary skill in the substrate coating arts may readily determine the etching time necessary to provide a desired depth of etching for a particular substrate. The substrate temperature at which the etching step should be carried out to remove the desired amount of binder material also will depend upon the character of the binder, but may be readily determined.

Deposits of a phase of $W_xCo_yC$ (wherein x=3–9 and y=2–6), also known as η (eta) phase, may form on the surface of composite material substrates. Eta phase is a hard and brittle carbon-deficient phase that may easily fracture and may be produced when etching substrates that include tungsten, carbon, and cobalt. The presence of eta phase significantly degrades the properties of composite material substrates used in material removal (i.e., cutting, drilling, threading, boring, etc.) applications and, therefore, the generation of eta phase preferably should be avoided during the etching and coating of composite material substrates and other substrates by appropriately adjusting the etching and coating conditions. For example, relative to composite material substrates including nickel binder, composite material substrates having cobalt binder should be etched at lower substrate temperatures in order to inhibit the formation of eta phase on the surface of the substrate. The inventors also have determined that if hydrogen gas is present during an etching step employing a gaseous etchant, the hydrogen may combine with any carbon present as WC and any cobalt within the substrate material and will thereby make the WC deficient in carbon, resulting in formation of an eta phase. One possible reaction representative of formation of an eta phase is as follows:

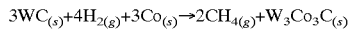

The eta phase does not convert to $CoCl_2$, as is required for the precursor elements of the eta phase to leave the substrate surface as a gas. The inventors have concluded that formation of eta phase is significantly inhibited when using nitrogen or certain other gases in substitution for hydrogen gas used in conjunction with etchant gas during the etching step. A representation of a possible reaction occurring during etching of a cobalt-containing composite material by a hydrogen chloride etchant gas, and wherein the etchant gas is not applied to the material in combination with hydrogen gas, is believed to be as follows:

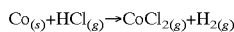

The $CoCl_2$ is a gaseous product that is swept from the coating furnace during the purging step.

Accordingly, the inventors have discovered that the step of etching a substrate including tungsten, carbon, and a binder phase including cobalt will not be satisfactorily accomplished if the gaseous etchant mixture includes hydrogen gas. For example, when etching binder phase from a composite material cutting insert composed of tungsten carbide particles in a binder composed predominantly of cobalt using a gaseous etchant mixture of hydrogen chloride and hydrogen gases, cobalt residue remains in the voids etched between the tungsten carbide particles and the undesirable eta phase may form, significantly reducing substrate toughness. The inventors have found that nitrogen gas may be advantageously substituted for hydrogen gas to prevent formation of eta phase. More broadly, to better ensure removal of etched binder material so as to avoid formation of eta phase on substrate surfaces, gases that may be substituted for hydrogen gas in the gaseous mixture used in the substrate etching step include those selected from one or more of nitrogen gas and other gases that do not react with the substrate or removed binder and that do not change the oxidation state of the substrate. Such other gases are believed to include, for example, helium, argon, and neon gases.

The foregoing representations of reactions that may occur during the etching process are provided only to better illustrate possible reaction mechanisms, and should not be considered to in any way limit the scope of the invention.

As discussed above, the etchant gas that may be used in the etching step of the method of the present invention may be any gas that will suitably remove the desired depth of binder phase in a surface region of the composite material substrate that is being etched. Such etchant gases include, for example, HCl gas, $H_2F_2$ gas, and the gaseous form of any of the Group VIIA elements in the periodic table of the elements.

The purging step occurring subsequent to the etching step is necessary to remove any products of the etching reaction and any etchant remaining in the chamber, and to reduce any explosion hazard. Any gas or combination of gases that will suitably remove the reactant products and remaining etchant gases and that will not react with the binder or hard particle constituents of the composite material may be used as the purging gas. Suitable purging gases include, for example, one or more of nitrogen, helium, and argon gases.

Once etched, the substrate may then be coated with a wear-resistant or other coating material by any conventional composite substrate coating process. Such processes include, for example, CVD, PVD, plasma arc, and super lattice processes. Still other composite material coating procedures will be readily apparent to those of ordinary skill in the substrate coating arts. All such other suitable coating processes may be used in the present method subsequent to the gas etching procedure. Any coating process used to deposit wear-resistant material on a composite material substrate etched by the procedure of the present method is carried out under conditions by which the wear-resistant material may at least partially infiltrate the voids in the composite material created by removal of the binder material. One of ordinary skill may readily determine such conditions without undue experimentation.

On a basic level, the present invention also is directed to a method for removing binder material from a region of a composite material, and the inventive method need not include the subsequent coating step. A composite substrate having a roughened surface may be produced by such a method. Roughened composite substrates may be used in a variety of known applications, including, for example, ball point pen balls, wherein a roughened surface provides enhanced traction. Additionally, substrates may be etched by the present method and then coated at some later time and/or at a different facility, rather than in a single procedure in which the etching and coating steps are combined. One example of a coating that may be applied in a procedure removed in time from the etching procedure and/or at another facility is a diamond coating.

Following are actual examples illustrating embodiments of the method of the present invention. The following examples are illustrative examples only, and should not be considered to in any way limit the scope of the present invention.

Example 1

A Bernex 250 CVD coating furnace was prepared by introducing into the coating chamber of the furnace a 10 l/min (liters/minute) flow of hydrogen gas to establish a 200 mbar hydrogen gas pressure within the chamber. The chamber was then heated to 850° C. A cemented carbide substrate composed of H-91 grade material available from Stellram, LaVergne, Tennessee, was placed in the prepared furnace chamber and the chamber atmosphere was heated to 850°. H-91 grade material is composed of 88.5 weight percent tungsten carbide, 11.0 weight percent cobalt, and 0.5 weight percent of a mixture of TiC, TaC, and NbC. The material exhibits a hardness of 89.7 HRA, 14.40 g/cc density, and a transverse rupture strength of approximately 389,000 psi.

The flow of hydrogen gas was then stopped, and a concurrent flow of 20 l/min nitrogen gas and 1 l/min hydrogen chloride gas was introduced into the chamber to provide a chamber pressure of 800 mbar. Binder was etched to a depth of approximately 5 microns into the substrate's surface by the running the concurrent $N_2$/HCl gas flow into the chamber for 25 minutes, and then discontinuing the flow of HCl gas. While maintaining the chamber atmosphere at 850° C., the chamber was then purged for 15 minutes by continuing the 20 l/min flow of $N_2$ gas while establishing a 60 mbar chamber pressure.

After purging the chamber, and without removing the etched substrate from the chamber, the etched substrate was coated with a moderate temperature milling and turning coating (referred to herein as "MT-milling coating"), which is a multi-layer insert coating consisting of two TiN layers of approximately 1 micron with a TiCN layer of approximately 3 microns disposed between the two TiN layers. The MT-milling coating was deposited on the substrate by introducing into the furnace chamber flows of gases that will produce coatings of TiN, TiCN, and then TiN, in that order, as follows.

Before the coating procedure began, the chamber atmosphere was heated to 920° C. and the chamber pressure was reset to 160 mbar. After that pressure was established, a first TiN layer was provided on the substrate by initiating a 9 l/min nitrogen gas flow, increasing the hydrogen gas flow to 14 l/min, and initiating a 2.1 ml/min flow of $TiCl_4$ gas. The concurrent flows of the three gases were allowed to proceed for 60 minutes while the chamber pressure was maintained at approximately 160 millibars. During the 60-minute period, the furnace temperature was lowered 5–10° C. every fifteen minutes so as to be at approximately 895° C. at the end of the period.

The interposed TiCN coating was produced by lowering the nitrogen gas flow to 8 l/min, and then resetting chamber pressure to 60 mbar. The $TiCl_4$ gas flow was then raised to 2.4 ml/min. Once all flows were constant, a flow of $CH_3CN$ gas generated by vaporizing a 0.3–0.4 ml/min flow of liquid $CH_3CN$ flow was initiated. The concurrent gas flows were continued for 2 hours, during the first hour of which the furnace temperature was reduced to 870° C. At the end of the 2-hour period, the flows of $CH_3CN$ and $TiCl_4$ gases were discontinued.

To prepare for deposition of the second TiN layer, the flow of nitrogen gas was discontinued, chamber pressure was set to 500 mbar, hydrogen gas flow was reset to 12 l/min, and furnace temperature was set at 940° C. When that temperature was reached, the pressure was set to 60 mbar, hydrogen gas flow was reset to 10.5 l/min, nitrogen gas flow was reset to 4.5 l/min, and $TiCl_4$ gas flow was reset to 1.4 ml/min. On reaching the target 1.4 l/min $TiCl_4$ gas flow rate, the flows were continued at temperature for 30 minutes, at which time the pressure was reset to 800 mbar and the gas flows were continued for an additional 30 minutes. The furnace was then purged by shutting off the $TiCl_4$ gas flow, resetting chamber pressure to 600 mbar, raising hydrogen gas flow to 12 l/min, and lowering nitrogen gas flow to 3.5 l/min. The reset gas flows were continued for fifteen minutes. The furnace was then subjected to a cool down procedure.

It was observed that the MT-milling coating infiltrated at least a portion of the voids etched in the substrate's surface.

Example 2

The Bemex 250 CVD furnace used in Example 1 was prepared using the procedure described in that example. A cermet substrate composed of SD-5 material, but having the same size and shape as the substrate in Example 1, was placed into the coating furnace and the furnace atmosphere was heated to 920° C. SD-5 material is a cermet grade material available from Stellram, LaVergne, Tenn., and is composed of TiCN and $Mo_2C$ particles in a Co/Ni binder. SD-5 material has the approximate elemental composition 45.2 Ti, 22.6 Mo, 10.9 C, 2.3 N, 19.0 Ni, and exhibits the following approximate mechanical properties: 91.8 HRA hardness, 6.30 g/cc density, and a transverse rupture strength of 300,000 psi. After heating the furnace atmosphere to 920° C., the Co/Ni binder was then etched to a depth of 5 microns from the substrate's surface using concurrent flows of hydrogen chloride and nitrogen gases at the flow rates, pressure, and reaction time used in Example 1 above. The furnace chamber was then purged using a 20 l/min flow of $N_2$ gas for 15 minutes at a chamber pressure of 60 millibars. The etched composite was then coated with an MT-milling coating using the procedure of Example 1. The MT-milling coating infiltrated the etched voids to a depth of 5 microns±approximately 1 micron, and with approximately 1 micron of the coating disposed above the substrate's surface.

Example 3

Three Stellram cutting inserts of type SEKN-42-AF4B composed of SD-5 material (as described in Example 2) were first etched and then coated with the MT-milling coating by the following procedure.

A CVD furnace chamber was prepared using the procedure described in Example 1. The SD-5 cutting inserts were then inserted into the furnace chamber and were etched using the procedure of Example 2. Once etched, the inserts were coated with MT-milling coating by the procedure of Example 1. The MT-milling coating produced on the etched inserts by the foregoing procedure was approximately 5 microns in thickness and the surface TiN layer infiltrated the voids etched in the inserts' surfaces. Approximately 5 microns of the coating extended above the inserts' surfaces. FIG. 1 is a photomicrograph (2040X) of a prepared cross-section through the surface of one of the etched and coated SD-5 inserts. The photomicrograph shows the infiltration of the MT-milling coating into the voids etched in the insert surface. The infiltration of the coating into the voids increased the adherence of the coating to the insert and improved the thermal shock resistance of the coating.

The three etched and coated SD-5 inserts and three inserts of the same type that were unetched and uncoated were inserted at one time into a six-insert Teledyne (Lavergne, Tenn.) HSM-3E4-45 EZ shear cutter that was then installed on a 2 H.P. Bridgeport milling machine and tested under the following milling conditions:

8620 steel at 20–25 Rockwell C hardness
    800 surface feet per minute
    0.050 inch depth of cut
    0.004–0.005 inches per tooth (feed rate)
    16.5 inch length of cut
    2.5 inch width of cut The SD-5 inserts were pulled and inspected after every two 16.5 inch milling passes. After the initial two passes, one uncoated SD-5 insert had one thermal crack started and the five remaining SD-5 inserts did not exhibit thermal cracks. After ten passes, all three unetched/uncoated SD-5 inserts exhibited one or more thermal cracks while only one etched and coated SD-5 insert exhibited a single thermal crack. Milling testing was concluded after 18 passes, at which point each unetched/uncoated insert exhibited 2–4 thermal cracks on their used edges, while only one thermal crack existed in one etched and coated insert. The conditions of an edge surface of each of the three etched/coated SD-5 inserts after 10 and 18 passes are shown in FIGS. 2a–c and 3a–c, respectively. The used edge conditions of the three unetched/uncoated SD-5 inserts after 10 and 18 passes are shown in FIGS. 4a–c and 5a–c, respectively.

Example 4

Three Stellram SEKN-42-AF4B cutting inserts composed of T-14 material were etched and then coated with an MT-milling coating by the method used in Example 3. T-14 material is a milling grade material available from Stellram (LaVergne, Tenn.) having a nominal composition composed of 70 weight percent tungsten carbide and 20 weight percent of a combination of tantalum carbide, niobium, and titanium carbide. Particles of the foregoing material are bound together by a cobalt binder that is 10 weight percent of the total weight of the material. T-14 material typically exhibits a hardness of 91.20 HRA, 12.43 g/cc density, and an average transverse rupture strength of 296,000 psi.

The three etched and coated T-14 inserts and three unetched and uncoated T-14 inserts of the same type were inserted at one time into a six-insert HSM-3E4-45 EZ shear cutter, installed on a 2 H.P. Bridgeport milling machine, and tested under the following milling conditions:

4140 steel at 40–45 Rockwell C hardness
    500 surface feet per minute
    0.050 inch depth of cut
    0.004–0.005 inch per tooth (feed rate)
    14 inch length of cut
    2.5 inch width of cut After four passes under the above conditions, the depth-of-cut regions of the etched and coated T-14 inserts showed no evidence of thermal cracking or deformation as examined under a 40X microscope. After four passes all unetched and uncoated T-14 inserts exhibited numerous thermal cracks with one insert at the thermal crack breakout stage. As used herein, "thermal crack breakout" is the point at which two or more thermal cracks connect and just before the insert surface fractures. Photomicrographs showing the condition of the depth-of-cut region of the three etched and coated T-14 inserts and the three unetched and uncoated T-14 inserts are shown in FIGS. 6a–c and 7a–c, respectively. The test demonstrated that using the present invention's method to etch composite substrates with cobalt binder to a 10 micron depth and then coating the substrates provides for a coated insert showing significant edge strength and enhanced resistance to coating/edge delamination, coating spalling, and edge fracture. Results similar to the SD-5 insert milling tests of Example 3 were achieved in that the T-14 substrates etched and coated by the present invention's method provide an increased resistance to thermal cracking of the cobalt-based material.

Example 5

Figure 8:
FIG. 8 is a photomicrograph of a metal cutting insert composed of H-91 material and coated with an MT-milling coating by the method of the present invention.

Stellram SEKN-42-AF4B type cutting inserts composed of H-91 grade material were obtained. Half of the H-91 inserts were coated with MT-mill coating in a Bernex 325 furnace using an automated procedure substantially similar to the above-described MT-milling coating procedure so as to provide a layered coating on the inserts composed of approximately 1 micron TiN, approximately 3 microns TiCN, and then 1 micron TiN, all such thicknesses being approximate. The remaining H-91 grade inserts were etched in a Bemex 250 CVD furnace using the procedure of Example 1 and the etched inserts were then MT-milling coated in the furnace by the procedure described in Example 3. Actual total MT-milling coating thicknesses were determined to be 6.2 microns for the unetched/coated inserts and 5.4 microns for the etched/coated inserts. A photomicrograph of the coated surface of one of the etched and coated H-91 inserts is shown in FIG. 8. The figure demonstrates the infiltration of the coating into the etched inserts' surfaces.

Figure 9:
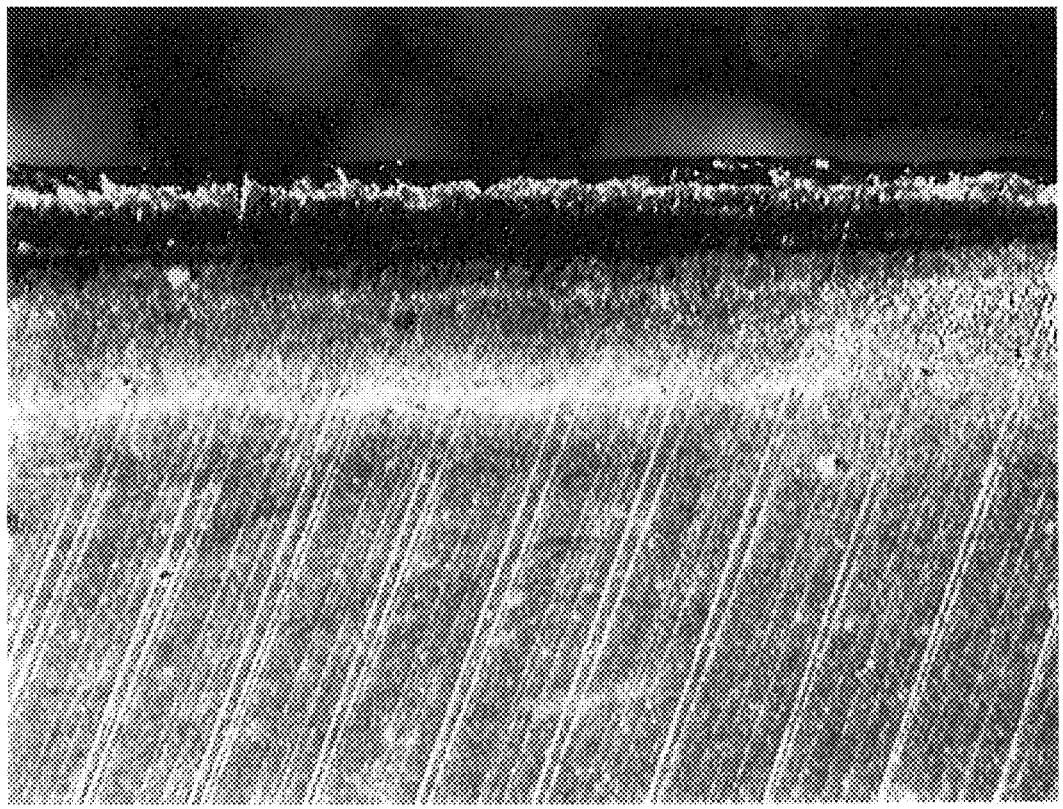
FIGS. 9 is a photomicrograph showing the condition of a metal cutting insert, composed of H-91 material and coated with an MT-milling coating by the method of the invention, after one milling pass.
Figure 10:
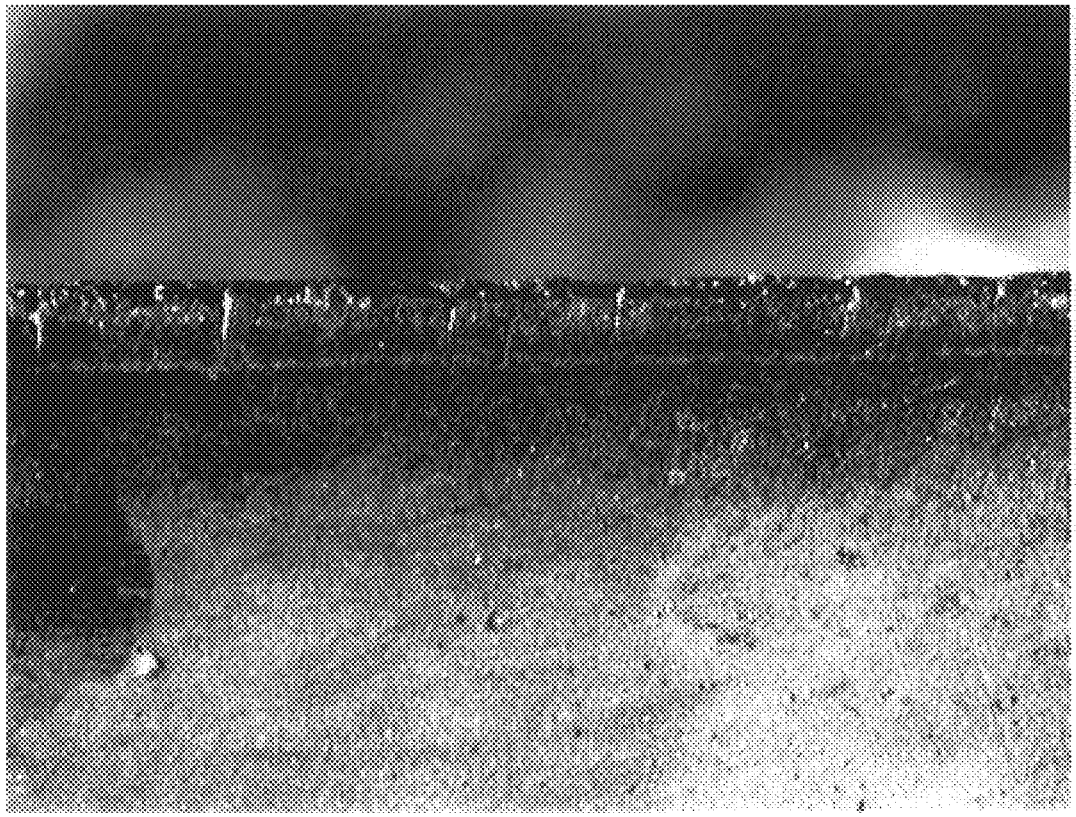
FIG. 10 is a photomicrograph showing the condition of a metal cutting insert, composed of H-91 material and coated with an MT-milling coating of TiN/TiCN/TiN layers totaling approximately 5 microns (applied by CVD), after one milling pass.
Figure 11A:
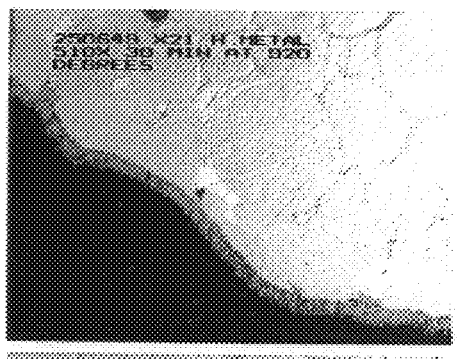
FIGS. 11a–11d are photomicrographs of a prepared section of a heavy metal part containing tungsten metal particles (about 90 weight percent of the part's total weight) suspended in an iron/nickel binder (about 10 weight percent of the part's total weight) that was etched and coated with an MT-milling coating by the method of the present invention.
Figure 11B:
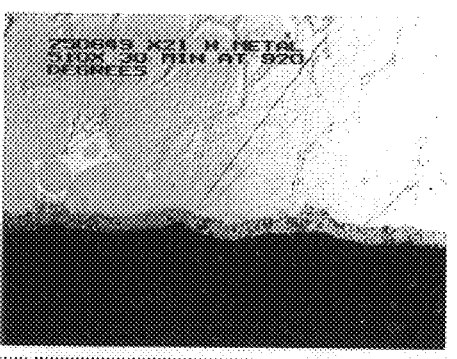
Figure 11C:
Figure 11D:

Single etched/coated or unetched/coated H-91 inserts were installed on a seven-insert Teledyne HSM-5E4-45 5-inch diameter EZ shear cutter, installed on a 25 H.P. Kearney-Trecker milling machine, and tested under the following milling conditions:

ASTM A536 (F-33100 unified UNS) nodular cast iron
    875 surface feet per minute
    0.125 inch depth of cut
    0.008 feet per tooth
    20 inch length of cut
    4 inch width of cut Each insert was pulled after one pass and examined. After one pass, each of the tested unetched/coated inserts exhibited 6–7 thermal cracks, while the tested inserts that had been etched and coated by the method of the present invention exhibited only a single thermal crack. 30X photomicrographs of an etched/coated H-91 insert after one milling pass and an unetched/coated insert after one milling pass are provided as FIGS. 9 and 10, respectively.

This example 5 compared inserts composed of identical base materials and identical coatings, with the only significant difference being that the test samples of one set were first etched by the present method and the MT-milling coating had infiltrated the resulting interstices in the inserts' surfaces. The etched and infiltrated inserts exhibited significantly increased resistance to thermal cracking relative to the unetched coated inserts.

Example 6

A heavy metal part containing 90 weight percent tungsten metal particles suspended in 10 weight percent of an iron/nickel binder was etched and coated with an MT-milling coating using the procedures of the invention as generally described in the foregoing examples involving insert composed of SD-5 material. 21X photomicrographs of sections of the etched and coated metal part taken through the coated surface are shown in FIGS. 11a–11d. The photomicrographs shown the infiltration of the coating into the voids etched in the metal part's iron-nickel binder.

In each of the foregoing Examples 1–5, all composite material substrates that were etched using the method of the present invention failed to show evidence of the formation of an eta phase.

Those of ordinary skill in the substrate coating and treatment arts will appreciate that various modifications and changes in the details of the invention that has been disclosed herein may be made without detracting from the advantages provided by the invention, and it will be understood that all such changes and modifications remain within the principle and scope of the invention as expressed in the appended claims.

We claim:

1. A method for applying a coating to at least a portion of the surface of a substrate, the substrate comprising particles of a hard material in a binder phase, the method comprising the acts of:
   removing a portion of said binder phase from said surface of said substrate by contacting said surface with a gas flow substantially free of hydrogen gas and comprising an etchant gas and a second gas for a period of time that will remove said portion of said binder phase to thereby provide an etched surface on said substrate, said etched surface comprising voids produced by removal of said portion of said binder phase, said second gas comprising one or more gases that will not react with said substrate or said portion and that will not change the oxidation state of said substrate during removal of said portion of said binder phase; and
   applying said coating to at least a portion of said etched surface, at least a portion of said coating being deposited within at least a portion of said voids in said etched surface.

2. The method recited in claim 1 wherein said second gas will not react with said substrate or said binder phase removed from said surface during said removing act to form an eta phase within said voids on said etched surface.

3. The method recited in claim 1 wherein said second gas is one or more selected from nitrogen gas, helium gas, argon gas, and neon gas.

4. The method recited in claim 1 wherein said etchant gas is one or more selected from hydrogen chloride gas, $H_2F_2$ gas, $F_2$ gas, $Cl_2$ gas, $Br_2$ gas, and $I_2$ gas.

5. The method recited in claim 4 wherein said gas flow comprises concurrent flows of hydrogen chloride gas and nitrogen gas.

6. The method of claim 1 wherein in said etching step said binder phase is removed from said surface to a depth of between about 3 microns to about 15 microns.

7. The method of claim 6 wherein in said etching step said binder phase is removed from said surface to a depth of between about 4 microns to about 6 microns.

8. The method of claim 1 wherein said substrate is selected from cemented carbides and cermets.

9. The method of claim 8 wherein said hard constituent material comprises one or more materials selected from the group consisting of:
   a carbide material selected from the group consisting of tungsten carbide, titanium carbide, tantalum carbide, niobium carbide, vanadium carbide, chromium carbide, molybdenum carbide, and iron carbide;
   a carbonitride of a refractory metal;
   a nitride of a refractory metal;
   a carbonitride of an element selected from the group consisting of W, Ti, Ta, Nb, V, Cr, Mo, and Fe;
   an oxide of an element selected from the group consisting of aluminum, zirconium, and magnesium;
   a boride of an element selected from the group consisting of aluminum, zirconium, and magnesium; and
   a material selected from the group consisting of tungsten, a molybdenum-containing material, and a tungsten-containing material.

10. The method of claim 1 wherein said binder phase comprises one or more materials selected from the group consisting of cobalt, nickel, iron, elements within Group VIII of the periodic table, copper, tungsten, zinc, and rhenium.

11. The method of claim 1 wherein said hard constituent material comprises tungsten carbide and wherein said binder phase comprises cobalt.

12. The method of claim 1 wherein said act of removing occurs within a chamber into which said gas flow is introduced.

13. The method of claim 1 wherein said coating enhances the wear resistance of said substrate.

14. The method of claim 13 wherein said coating is comprised of one or more materials selected from the group consisting of TiC, TiN, TiCN, diamond, $Al_2O_3$, TiAlN, HfN, HfCN, HfC, ZrN, ZrC, ZrCN, $Cr_3C_2$, CrN, and CrCN.

15. The method of claim 13 wherein said coating is an MT-milling coating.

16. The method of claim 1 wherein:
   said substrate is selected from the group consisting of metal cutting inserts, dies, punches, stamps, threading devices, blanking devices, milling devices, turning devices, drilling devices, boring devices, mining bits, drilling bits, tricone bits, percussive bits, road planing devices, wood working bits, wood working blades, drawing devices, heading devices, back extrusion devices, rod mill roll devices, and wear parts used in corrosive environments; and
   said coating enhances the wear resistance of said substrate.

17. The method of claim 16 wherein said coating is an MT-milling coating.

18. A method for applying a coating to a substrate, the method comprising:
   providing a substrate comprising particles of a hard material in a binder phase;
   contacting at least the surface of said substrate with a gas flow free of hydrogen gas, said gas flow comprising an etchant gas and a second gas, to thereby remove at least a portion of said binder phase from said surface and provide voids in said surface, said second gas consisting of one or more gases that will not react with said substrate and that will not change the oxidation state of said substrate during removal of said portion of said binder phase; and
   applying a coating to at least a portion of said substrate so that said coating is at least partially disposed within at least a portion of said voids.

19. A substrate coating method comprising:

providing a substrate including particles of a hard material in a binder phase;

removing at least a portion of said binder phase from said surface of said substrate by contacting said surface with a gas flow comprising an etchant gas and at least one additional gas for a period of time sufficient to remove said portion of said binder phase and to thereby provide an etched surface on said substrate, said etched surface comprising voids produced by removal of said portion of said binder phase, said gas flow free from any gas that will react with said substrate or said portion or will change the oxidation state of said substrate during removal of said portion of said binder phase; and applying a coating to at least a portion of said etched surface, at least a portion of said coating being deposited within at least a portion of said voids in said etched surface.

* * * * *